United States Patent
Troyer et al.

(10) Patent No.: US 9,152,746 B2
(45) Date of Patent: Oct. 6, 2015

(54) QUANTUM ANNEALING SIMULATOR

(71) Applicant: Microsoft Corporation, Redmond, WA (US)

(72) Inventors: Matthias Troyer, Zurich (CH); David B. Wecker, Redmond, WA (US); Bela Bauer, Santa Barbara, CA (US)

(73) Assignee: Microsoft Technology Licensing, LLC, Redmond, WA (US)

( * ) Notice: Subject to any disclaimer, the term of this patent is extended or adjusted under 35 U.S.C. 154(b) by 254 days.

(21) Appl. No.: 13/850,867

(22) Filed: Mar. 26, 2013

(65) Prior Publication Data

US 2014/0297247 A1 Oct. 2, 2014

(51) Int. Cl.
*G06F 17/50* (2006.01)
*G06N 99/00* (2010.01)

(52) U.S. Cl.
CPC .......... *G06F 17/5009* (2013.01); *G06N 99/002* (2013.01)

(58) Field of Classification Search
CPC ............. G06F 9/00; G06F 15/18; G06G 7/62; G06K 9/00; G06N 3/12; G06N 7/02; H01L 39/22
USPC ........ 703/15, 13; 706/13, 52; 713/1; 382/159
See application file for complete search history.

(56) References Cited

U.S. PATENT DOCUMENTS

| | | | |
|---|---|---|---|
| 2009/0087084 A1* | 4/2009 | Neigovzen et al. | 382/159 |
| 2009/0299947 A1* | 12/2009 | Amin et al. | 706/52 |
| 2010/0306142 A1 | 12/2010 | Amin | |
| 2011/0054876 A1* | 3/2011 | Biamonte et al. | 703/15 |
| 2011/0060710 A1* | 3/2011 | Amin | 706/13 |
| 2012/0210111 A1* | 8/2012 | Ozols et al. | 713/1 |
| 2012/0278057 A1 | 11/2012 | Biamonte et al. | |

OTHER PUBLICATIONS

Ohzeki, et al., "Quantum Annealing: An introduction and New Developments", Journal of Computational and Theoretical Nano Science, May 26, 2010, 9 pgs.

Rose, et al., "An Introduction to Quantum Annealing", Proceedings of DWAVE, Technical Document 0712, Aug. 10, 2007, 3 pages.

Smelyanskiy, et al., "A Near-Term Quantum Computing Approach for Hard Computational Problems in Space Exploration", retrieved on Nov. 30, 2012 at <<http://arxiv.org/pdf/1204.2821.pdf>>, Technical Report, Apr. 18, 2012, 69 pages.

Suzuki, et al., "Study on Quantum Annealing Using the Density Matrix", Interdisciplinary Information Sciences, vol. 13, No. 1, Mar. 2007, pp. 49-55.

Temme, et al., "Quantum Metropolis Sampling", Macmillan Publishers Limited, Nature, vol. 471, Mar. 3, 2011, 33 pgs.

Yousefabadi, "Optimal Annealing Paths for Adiabatic Quantum Computation", Master's Thesis, Dalhousie University, Halifax, Nova Scotia, Dec. 2011, 80 pages.

* cited by examiner

*Primary Examiner* — Kandasamy Thangavelu
(74) *Attorney, Agent, or Firm* — Steve Wight; Judy Yee; Micky Minhas

(57) ABSTRACT

A quantum annealer simulator approximates unitary quantum dynamics of a quantum annealer on a non-quantum computing device such as a conventional computing device. The quantum annealer simulator may utilize algorithms that may efficiently approximate unitary time evolution of a quantum system, where the quantum system corresponds to a problem for which an optimized solution is sought.

20 Claims, 5 Drawing Sheets

QUANTUM ANNEALING SIMULATOR

BACKGROUND

In a classical annealer, the solution to a hard optimization problem is found by mapping the problem to a model system, and then simulating the model system on a conventional computer (i.e., a non-quantum computer such as a digital computer). In the simulation of the model system, the temperature of the model system is lowered, and as the temperature is lowered in the simulation, the energy of the model system drops into a low energy state that is a nearly optimal solution of the optimization problem.

Quantum annealers are hardware systems (e.g., a quantum computer such as the D-WAVE ONE, by D-Wave Systems) that find solutions to hard optimization problems by evolving a quantum system from a simple initial state to a solution of the hard problem by slowly changing the parameters of a control Hamiltonian. With a quantum annealer, unitary time evolution and quantum tunneling can provide speedup over classical annealing and classical optimization algorithms.

A quantum annealer is initialized with a quantum system at low or zero temperature with very strong quantum fluctuations and with the quantum system in a simple and known state. The quantum fluctuations allow the quantum system to tunnel between states. The strength of the quantum fluctuations are slowly turned off to arrive at the optimal or a near-optimal solution.

Concretely, at the initial time $t=0$ the quantum system of the quantum annealer is initialized in the ground state (i.e., lowest energy state). The quantum system is described by a Hamiltonian $H(0)$ that evolves over time (i.e., the Hamiltonian is a function of time $H(t)$) to a final Hamiltonian $H(t_{final})$ at time $t=t_{final}$. The low energy states of the Hamiltonian $H(t_{final})$ provide good solutions to an optimization problem. Tunneling effects due to quantum mechanics give such a quantum annealer a substantial advantage over classical annealers.

However, it is very expensive and hard to build quantum hardware for a quantum annealer.

Further, simulating quantum systems is exponentially hard which more than wipes out any advantage due to quantum tunneling.

SUMMARY

As discussed hereinbelow, this disclosure describes a new and efficient quantum annealer simulator.

The quantum annealer simulator approximates unitary quantum dynamics of a quantum annealer on a non-quantum computing device such as a conventional computing device. In particular, the quantum annealer simulator may be implemented by a non-quantum processing system such as a conventional digital processor.

The quantum annealer simulator may utilize algorithms that may efficiently approximate unitary time evolution of a quantum system, where the quantum system corresponds to a problem for which an optimized solution is sought.

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter.

BRIEF DESCRIPTION OF THE DRAWINGS

The detailed description is described with reference to the accompanying figures. In the figures, the left-most digit(s) of a reference number identifies the figure in which the reference number first appears. The same reference numbers in different figures indicate similar or identical items.

DETAILED DESCRIPTION

Overview

Figure 1:
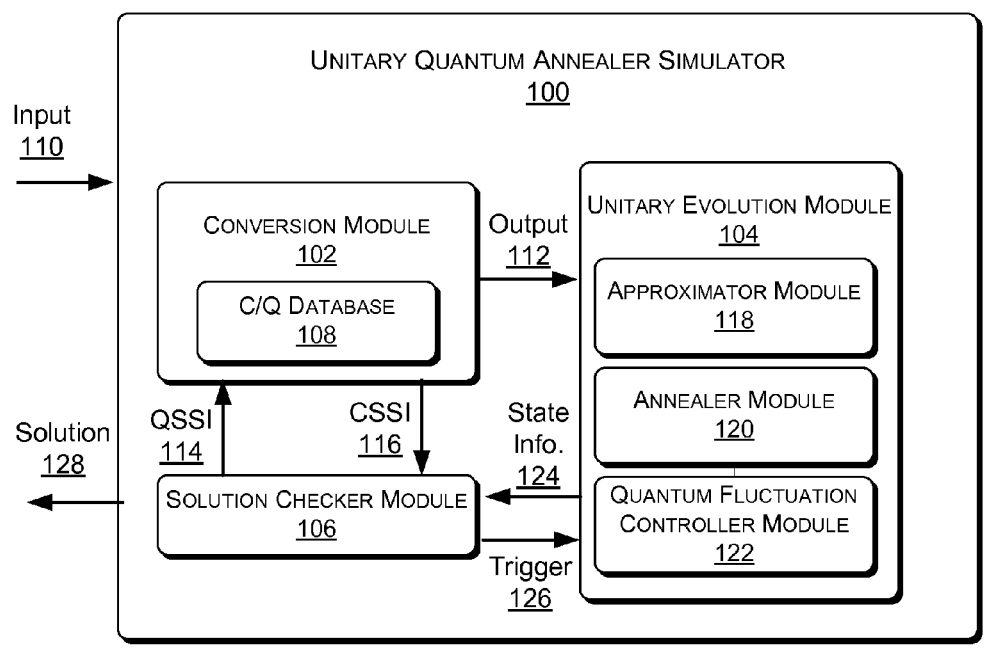
FIG. 1 is a schematic diagram of a unitary quantum annealer simulator.

This disclosure describes a cost-effective and efficient simulator of a quantum annealer on a classical computer (i.e., a non-quantum computer such as a digital computer). As provided below, efficient computable approximations to the quantum unitary evolution of a simulated system are utilized to speed up the time for finding the solution to optimization problems on classical computers. The speedup may be comparable to the speedup previously provided by quantum hardware.

A quantum annealer simulator may provide an approximate simulation of the unitary dynamics of a quantum annealer on a classical computer.

In some embodiments, the unitary evolution of the quantum system may be approximated using algorithms that can be efficiently performed. In some instances, this approximation can be a mean-field approximation, a semi-classical approach, or evolution in truncated Hilbert spaces such as those obtained by matrix product states, tensor network states, density matrix renormalization group methods or similar truncation and renormalization group schemes. While these approximations do not faithfully track the evolution of the original quantum system, they efficiently capture the evolution of a slightly modified quantum system which also profits from quantum speedup in the annealing process.

In some embodiments, the unitary evolution may be combined with thermal cooling to obtain a hybrid quantum and thermal annealer. The thermal cooling can either be combined with the unitary quantum evolution—using evolution by complex valued time steps—or one can alternate between unitary quantum dynamics and thermal cooling steps during the annealing process. The thermal cooling can either be an imaginary time evolution or projection algorithm that lowers the energy of the quantum state, or it be a stochastic Monte Carlo or quantum Monte Carlo algorithm.

By approximating the unitary dynamics of the quantum system it becomes efficiently computable on classical computers while retaining advantages over currently known annealing, simulated annealing, and simulated quantum annealing algorithms.

The processes and systems described herein may be implemented in a number of ways. Example implementations are provided below with reference to the following figures.

This brief introduction, including section titles and corresponding summaries, is provided for the reader's convenience and is not intended to limit the scope of the claims, nor the proceeding sections. Furthermore, the techniques described above and below may be implemented in a number of ways and in a number of contexts. Several example implementations and contexts are provided with reference to the following figures, as described below in more detail. However, the following implementations and contexts are but a few of many. For instance, and as discussed above, these techniques apply to a variety of content output devices and for a variety of media streams, including audio streams, video streams and any other form of media stream.

Illustrative Unitary Quantum Annealer Simulator

FIG. 1 is a schematic diagram of a unitary quantum annealer simulator 100. The unitary quantum annealer simulator 100 may include a conversion module 102, a unitary evolution module 104, and a solution checker module 106.

The conversion module 102 may convert an expression of a classical problem, or classical system, to a corresponding quantum system and vice-versa. The conversion module 102 may include a classical/quantum database 108 and may utilize the classical/quantum database 108 to convert classical problems/systems to corresponding quantum systems and vice-versa. The classical/quantum database 108 may include models of classical problems/systems and corresponding quantum problems/systems. As one example, the classical/quantum database 108 may include a model of a Traveling Salesman Problem, which can be expressed classically (i.e., without utilizing quantum mechanical wave functions) and an analogous quantum problem.

In some instances, the conversion module 102 may receive input 110. The input 110 may be an expression of a classical problem. The conversion module 102 may convert the input 110 into an analogous quantum system and provide output 112, corresponding to the analogous quantum system, to the unitary evolution module 104.

In some instances, the input 110 may be an expression of a quantum problem/system, and the conversion module 102 may provide the unitary evolution module 104 with output 112, where the output 112 is an expression of a quantum problem/system corresponding to the input 110. In some instances, the input 110 and the output 112 may be the same or may be similar.

The conversion module 102 may also receive quantum system state information 114 from the solution checker module 106. The quantum system state information 114 provides current state information for a quantum system being optimized by the unitary quantum annealer simulator 100. The conversion module 102 may convert the quantum system state information 114 into corresponding classical system state information 116, which may provided to the solution checker module 106.

The unitary evolution module 104 may include an approximator module 118, an annealer module 120, and a quantum fluctuation controller module 122. The approximator module 118 may include algorithms that can be efficiently performed to approximate unitary evolution of a quantum system, such algorithms may include, but are not limited to, a mean-field approximation, a semi-classical approach, or evolution in truncated Hilbert spaces such as those obtained by matrix product states, tensor network states, density matrix renormalization group methods or similar truncation and renormalization group schemes.

The annealer module 120 may include algorithms that can thermally cool a quantum system being optimized by the quantum annealer simulator 100. (As discussed herein, to thermally cool a quantum system means to reduce the energy or generalized momenta of the quantum system.) The thermal cooling can either be combined with the unitary quantum evolution—using evolution by complex valued time steps— or one can alternate between unitary quantum dynamics and thermal cooling steps during the annealing process. The thermal cooling can either be an imaginary time evolution or projection algorithm that lowers the energy of the quantum state, or it be a stochastic Monte Carlo or quantum Monte Carlo algorithm.

The quantum fluctuation controller module 122 may vary one or more parameters in the quantum system being optimized to control the strength of quantum fluctuations. The quantum fluctuation controller module 122 may be utilized to enhance, reduce, or prevent, quantum tunneling in the quantum system being optimized.

In some instances, the unitary evolution module 104 may utilize the approximator module 118 and either one or both of the annealer module 120 and the quantum fluctuation controller module 122 when optimizing the quantum system. The unitary evolution module 104 may capture state information 124 of the quantum system being optimized and may provide the state information 124 to the solution checker module 106. The state information 124 may be captured from time to time such as after a number of iterations or based on a rate of convergence of the state information 124 or some other criteria.

The solution checker module 106 may check whether the state information 124 corresponds to an optimal or satisfactory solution. In some instances, the problem/system being optimized may be difficult to solve but may be easy to verify. In some instances, the solution checker module 106 may use the state information 124 to verify whether the state information 124 is an optimal or satisfactory solution.

In some instances, the solution checker may include some or all of the state information 124 in the quantum system state information 114 and may then receive the classical system state information 116. The solution checker module 106 may utilize the classical system state information 116 to determine whether the state information 124 corresponds to an optimal or satisfactory solution.

In the event that the state information 124 does not correspond to an optimal or satisfactory solution, the solution checker module 106 may provide the unitary evolution module with a trigger 126, which may cause the unitary evolution module 104 to continue to calculate an optimal or satisfactory solution to the quantum system.

In the event that the state information does correspond to an optimal or satisfactory solution, the solution checker module 106 may provide solution 128. In some instances, solution 128 may include classical system state information 116 and/or may include state information 124.

Time Evolution Overview

Time evolution of the quantum system may be described by the Schrödinger equation:

$$H(t)|\psi(t)\rangle = i\hbar \frac{\partial}{\partial t}|\psi(t)\rangle, \qquad (1)$$

where H(t) is the Hamiltonian of the quantum system and $|\psi(t)\rangle$ is the state of the quantum system written in Bra-ket notation. The Hamiltonian H may be written as:

$$H(t)=H_0+V(t), \qquad (2)$$

where $H_0$ may represent the Hamiltonian of the desired problem being optimized and V(t) may represent a time-dependent function that drives the state of the quantum system from an initial state $|\psi(t_0)\rangle$ to a final state $|\psi(t_f)\rangle$.

The time-dependent function V(t) may provide quantum fluctuations to the quantum system. In some instances, the time-dependent function V(t) may be varied from a initial value $V(t_0)=V_0$ to a final value $V(t_f)=V_f$, where $V_0>V_f$, and in some instances, $V_0$ may be greater than $H_0$. In some instances, the final value $V(t_f)=V_f$ may be zero. In some instances, the time-dependent function V(t) may be monotonically decreased from the initial to final values.

In some instances, the initial state $|\psi(t_0)\rangle$ of quantum system by be in a ground state, or least energy state, of the time-dependent function V(t).

In some instances, the Hamiltonian H may be written as:

$$H(t)=\lambda(t)H_0+V(t), \quad (3)$$

where $\lambda(t)$ is a time dependent function that scales $H_0$.

In the following discussion, $\lambda(t)$ and V(t) are described as varying linearly with time. However, such discussion is provided merely for the sake of completeness and to provide a clear, non-limiting, example. It is understood that $\lambda(t)$ and V(t) are not limited to linear functions nor to monotonic functions.

Assume that $\lambda(t)$ and V(t) are described as follows:

$$\lambda(t) = 1 - \frac{(T-t)}{T}, \text{ and} \quad (4)$$

$$V(t) = \frac{(T-t)}{T}V_0, \quad (5)$$

where the quantum system is evolved from time t=0 to time t=T. The quantum system may be evolved by time steps of size $\Delta t$ such that time $t_n=n\Delta t$ and $T=N\Delta t$. The quantum system may then be written as $$H(n\Delta t)|\psi(n\Delta t)\rangle = \left(\left(1 - \frac{(N-n)}{N}\right)H_0 + \frac{(N-n)}{N}V_0\right)|\psi(n\Delta t)\rangle. \quad (6)$$

At time t=0 (n=0), $\lambda(0)=0$ and $V(0)=V_0$, and the quantum system is given by:

$$H(0)|\psi(0)\rangle = V_0|\psi(0)\rangle. \quad (7)$$

At time $t_m=m\Delta t$, the quantum system is given by:

$$H(m\Delta t)|\psi(m\Delta t)\rangle = \left[\left(1 - \frac{(N-m)}{N}\right)H_0 + \frac{(N-m)}{N}V_0\right]|\psi(m\Delta t)\rangle. \quad (8)$$

The strength of the quantum fluctuation term (V(t)) diminishes as the quantum system is evolved and the strength of the desired Hamiltonian of problem being optimized (i.e., $H_0$) increases as the quantum system is evolved.

Finally, at time $T=N\Delta t$, the quantum system is given by:

$$H(N\Delta t)|\psi(N\Delta t)\rangle = H_0|\psi(N\Delta t)\rangle. \quad (9)$$

The quantum system has been evolved from a given initial state $|\psi(0)\rangle$ to a final state $|\psi(N\Delta t)\rangle$ and is expressed in terms of the desired Hamiltonian of problem being optimized.

In some instances, the Hamiltonian H may be written as:

$$H(t)=\lambda(t)H_0+V(t)+K(t), \quad (10)$$

where $\lambda(t)$ is a time dependent function that scales $H_0$, V(t) is a time dependent function that provides quantum fluctuations to the quantum system and K(t) is a time dependent thermal-annealer term that quenches thermal energy from the quantum system and/or holds/drives thermal energy of the quantum system to a predetermined value.

It should be noted that in a system of particles, thermal energy is proportional to the momenta (or first derivative of position) of the particles and that the Hamiltonian H may be written as $$H=H(q(t),p(t),t) \quad (11)$$

where q(t) and p(t) are the generalized coordinates and generalized momenta of the system, respectively. For generalized systems, the time dependent thermal-annealer function K(t) quenches the generalized momenta from the quantum system and/or holds/drives the generalized momenta of the quantum system to a predetermined value.

The thermal-annealer function may be combined with the unitary quantum evolution—using evolution by complex valued time steps—or by alternating between unitary quantum dynamics and thermal cooling steps during the annealing process. The thermal-annealer function may be an imaginary time evolution or projection algorithm that lowers the energy of the quantum state, or it may be a stochastic Monte Carlo or quantum Monte Carlo algorithm.

Process Overview: Unitary Evolution

Figure 2:
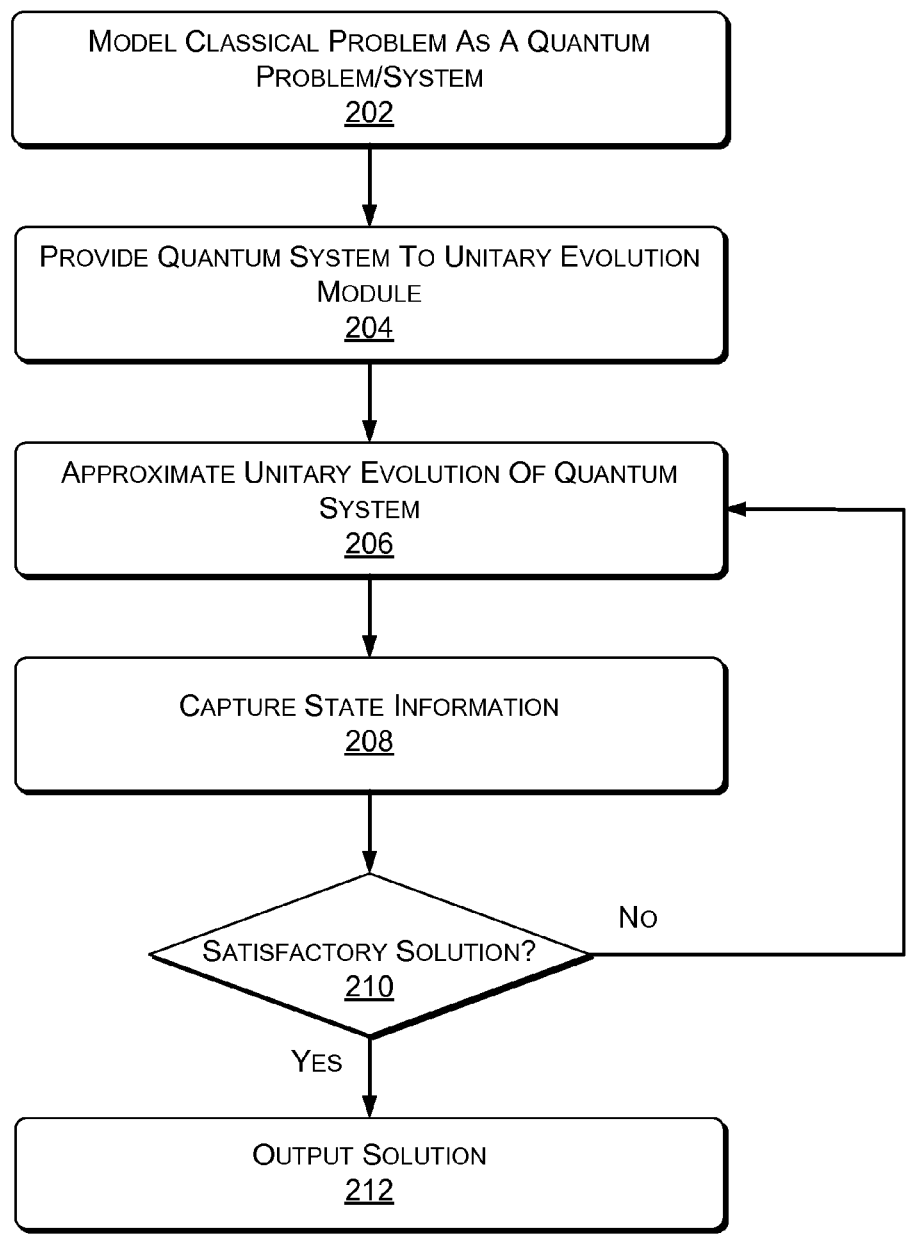
FIG. 2 is a flow diagram of an illustrative process for finding an optimal, or satisfactory, solution to a problem with a unitary quantum annealer simulator.

FIG. 2 is a flow diagram of an illustrative process 200 for finding an optimal, or satisfactory, solution to a problem with the unitary quantum annealer simulator 100. The process 200 and other processes described hereinbelow are illustrated as a collection of blocks in a logical flow graph, which represent a sequence of operations that can be implemented in hardware, software, or a combination thereof. In the context of software, the blocks represent computer-executable instructions stored on one or more computer-readable storage media that, when executed by one or more processors, perform the recited operations. Generally, computer-executable instructions include routines, programs, objects, components, data structures, and the like that perform particular functions or implement particular abstract data types. The order in which the operations are described is not intended to be construed as a limitation, and any number of the described blocks can be combined in any order and/or in parallel to implement the process. Other processes described throughout this disclosure, in addition to process 200, shall be interpreted accordingly.

At 202, a classical problem (i.e., a non-quantum mechanical problem) for which an optimal, or near optimal, solution is sought, is modeled as a quantum system, which may be expressed mathematically as a multivariable function. The multivariables may include generalized coordinates and generalized momenta. The solution of the quantum system may be found by minimizing the function describing the quantum system with respect to one or more variables.

In some embodiments, the conversion module 102 may be utilized to convert the classical problem to a corresponding quantum system.

In some instances, the classical problem for which an optimal, or near optimal, solution is sought may be an NP (nondeterministic polynomial time) problem or NP type problem including NP-complete and NP-hard problems. These types of problems are generally difficult to solve but are easy to verify. Verifying a solution may involve simple mathematical operators such as multiplication, whereas finding the solution may involve many determinations/decisions. Finding prime factors of a number is one example of an NP problem. Once the prime factors are determined, the solution can be verified by multiplying the prime factors, but solving the problem involves trying out many candidate solutions.

The Traveling Salesman Problem (TSP) is one example of an NP hard problem. The TSP asks the question: given a list of cities and distances between each pair of cities, what is the shortest possible route that visits each city exactly once and returns to the origin city. The TSP has applications to planning and logistics and may be modified for other applications.

In some instances, applications for the problems in which an optimal, or near optimal, solution is sought may include cryptography, network analysis, data storage, data retrieval, sequencing (e.g., sequencing on one processor) and scheduling (e.g., multiprocessor scheduling).

At 204, the quantum system is provided to the unitary evolution module 104.

At 206, unitary evolution of the quantum system is approximated. In some embodiments, the unitary evolution of the quantum system may be approximated using algorithms that can be efficiently performed. In some instances, this approximation can be a mean-field approximation, a semi-classical approach, or evolution in truncated Hilbert spaces such as those obtained by matrix product states, tensor network states, density matrix renormalization group methods or similar truncation and renormalization group schemes.

At 208, current state information of the quantum system is captured. In some embodiments, the current state information may be captured from time to time such as after a number of iterations by the unitary evolution module 104.

At 210, the unitary quantum annealer simulator 100 determines whether the current state information corresponds to an optimal or satisfactory solution.

If negative, the process returns to 206, and if affirmative, the process continues at 212.

At 212, the unitary quantum annealer simulator 100 provides a solution output. In some instances, the solution output may include state information of the quantum system that was optimized. In some instances, the solution output may include classical system state information. The classical system state information may correspond to the classical limit of the state information for the quantum system that was optimized.

In some embodiments, the current state information may be captured after the quantum system has been evolved to a final state. In such embodiments, the decision at 210 may be omitted. The unitary quantum annealer simulator 100 may evolve the quantum system, by increments of a time step $\Delta t$, from an initial time ($t_0$) to a final time ($t_f=t_0+n\Delta t$) and capture the state information of the quantum system at the final time. The unitary quantum annealer simulator 100 may provide solution output corresponding to the captured state information. In some instances, the solution output may include classical system state information, which corresponds to the classical limit of the captured state information for the quantum system at the final time.

Process: Unitary Evolution with Adiabatic Quantum Annealer

Figure 3:
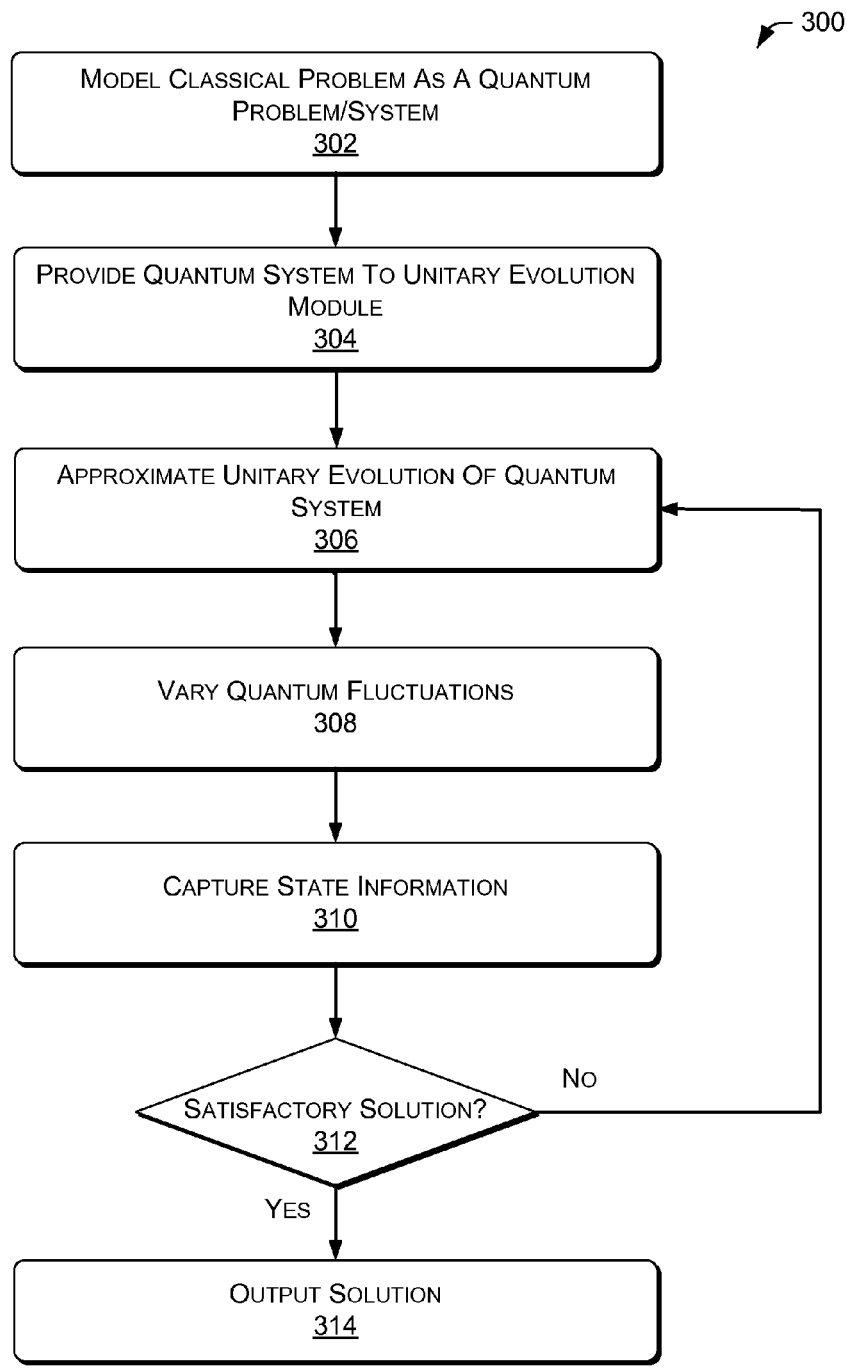
FIG. 3 is a flow diagram of an illustrative process for finding an optimal, or satisfactory, solution to a problem with a unitary quantum annealer simulator that employs quantum fluctuations.

FIG. 3 is a flow diagram of an illustrative process 300 for finding an optimal, or satisfactory, solution to a problem with the unitary quantum annealer simulator 100 employing adiabatic quantum annealing.

At 302, a classical problem (i.e., a non-quantum mechanical problem) for which an optimal, or near optimal, solution is sought, is modeled as a quantum system, which may be expressed mathematically as a multivariable function. For example, a classical problem such as binary quadratic optimization problem or another NP-complete problem may be mapped to quantum problem such as an Ising spin glass model with a transverse magnetic field, where the transverse magnetic field induces quantum fluctuations in the Ising spin glass. The solution of the quantum system may be found by minimizing the function describing the quantum system with respect to one or more variables. In some instances, the expression of the quantum system may have the form of equations (2) or (3), i.e., a first term representing the desired problem to be optimized ($H_0$), which may be scaled by $\lambda(t)$, and a second term for varying the strength of quantum fluctuations, V(t).

In some embodiments, the conversion module 102 may be utilized to convert the classical problem to a corresponding quantum system.

In some instances, the initial state $|\psi(t_0)\rangle$ of the quantum system may be a ground state, or least energy state, of the time-dependent function for varying the strength of quantum fluctuations, V(t).

At 304, the quantum system is provided to the unitary evolution module 104.

At 306, unitary evolution of the quantum system is approximated. The quantum system (i.e., the Hamiltonian H(t) and the state $|\psi(t)\rangle$) may be evolved by increments of $\Delta t$ from a present time ($t_n=t_0+n\Delta t$) to a next/future time ($t_{n+1}=t_n+\Delta t$). In some embodiments, the unitary evolution of the quantum system may be approximated by the approximator module 118 using algorithms for approximating a mean-field approximation, a semi-classical approach, or evolution in truncated Hilbert spaces such as those obtained by matrix product states, tensor network states, density matrix renormalization group methods or similar truncation and renormalization group schemes.

At 308, the quantum fluctuation controller module 122 may vary the time dependent function(s) of the Hamiltonian of the quantum system. In some instances, the quantum fluctuation controller module 122 may vary the value of the time-dependent function(s) (e.g., $\lambda(t)H_0$ and V(t)), after each time step, and in other instances, the quantum fluctuation controller module 122 may vary the value of the time-dependent function(s) after a predetermined number of time steps. Typically, the quantum fluctuation controller module 122 may vary the value of the time-dependent function(s) such that changes to the quantum system due to varying the time-dependent function(s) are adiabatic.

At 310, current state information of the quantum system is captured by the unitary evolution module 104. The current state information may include the Hamiltonian $H(t_n)$ and the state $|\psi(t_n)\rangle$ of the quantum system at the current time $t_n$. In some embodiments, the unitary evolution module 104 may capture the current state information after a number of iterations (i.e., after the quantum system has been evolved over a number time steps $\Delta t$).

At 312, the unitary quantum annealer simulator 100 determines whether the current state information corresponds to an optimal or satisfactory solution.

If negative, the process returns to 306, and if affirmative, the process continues at 314.

At 314, the unitary quantum annealer simulator 100 provides a solution output. In some instances, the solution output may include state information of the quantum system that was optimized. In some instances, the solution output may include classical system state information. The classical system state information may correspond to the classical limit of the state information for the quantum system that was optimized.

In some embodiments, the current state information may be captured after the quantum system has been evolved to a final state. In such embodiments, the decision at 312 may be omitted.

Process: Unitary Evolution with Adiabatic Quantum Annealer and Thermal Annealer

Figure 4:
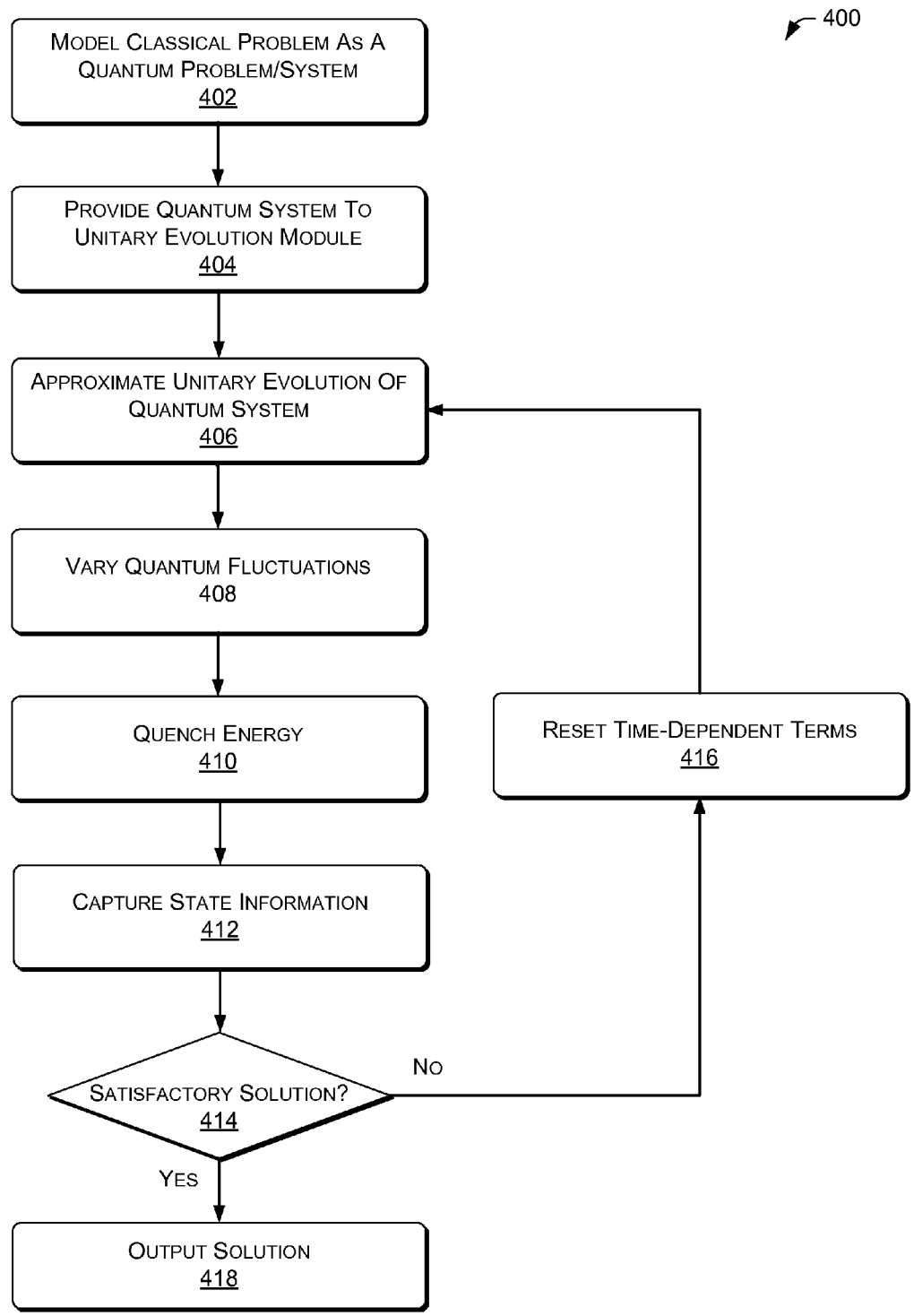
FIG. 4 is a flow diagram of an illustrative process for finding an optimal, or satisfactory, solution to a problem with a unitary quantum annealer simulator that employs quantum fluctuations and thermal annealing.

FIG. 4 is a flow diagram of an illustrative process 400 for finding an optimal, or satisfactory, solution to a problem with the unitary quantum annealer simulator 100 employing quantum fluctuations and thermal annealing.

At 402, a classical problem (i.e., a non-quantum mechanical problem) for which an optimal, or near optimal, solution is sought, is modeled as a quantum system, which may be expressed mathematically as a multivariable function. The solution of the quantum system may be found by minimizing the function describing the quantum system with respect to one or more variables while quenching the energy or generalized momenta of the quantum system towards the ground state as the quantum fluctuations are slowly turned off. In some instances, the expression of the quantum system may have the form of equation (10), i.e., a first term representing the desired problem to be optimized ($H_0$), which may be scaled by $\lambda(t)$, a second term for varying the strength of quantum fluctuations, $V(t)$, and a third term $K(t)$ that lowers the energy (or the generalized momenta) of the quantum system. For example, a classical problem such as a binary quadratic optimization problem or another NP-complete problem may be mapped to an Ising spin glass model ($H_0$) with an transverse magnetic $V(t)$ and a heat bath, where the transverse magnetic field induces quantum fluctuations, and where $K(t)$ can be coupling to the heat bath (fridge) that cools the system.

In some embodiments, the conversion module 102 may be utilized to convert the classical problem to a corresponding quantum system.

In some instances, the initial state $|\psi(t_0)\rangle$ of quantum system by be in a ground state, or least energy state, of the time-dependent function for varying the strength of quantum fluctuations, $V(t)$.

At 404, the quantum system is provided to the unitary evolution module 104.

At 406, unitary evolution of the quantum system is approximated. The quantum system (i.e., the Hamiltonian $H(t)$ and the state $|\psi(t)\rangle$ may be evolved by increments of $\Delta t$ from a present time ($t_n = t_0 + n\Delta t$) to a next/future time ($t_{n+1} = t_n + \Delta t$), where n is the number of time steps at the present time. In some embodiments, the unitary evolution of the quantum system may be approximated by the approximator module 118 using algorithms for approximating a mean-field approximation, a semi-classical approach, or evolution in truncated Hilbert spaces such as those obtained by matrix product states, tensor network states, density matrix renormalization group methods or similar truncation and renormalization group schemes.

At 408, the quantum fluctuation controller module 122 may vary the time dependent function the time-dependent function for varying the strength of quantum fluctuations, $V(t)$. In some instances, the quantum fluctuation controller module 122 may vary the value of the time-dependent function $V(t)$ after each time step, and in other instances, the quantum fluctuation controller module 122 may vary the value of the time-dependent function $V(t)$ after a predetermined number of time steps. Typically, the quantum fluctuation controller module 122 may vary the value of the time-dependent function $V(t)$ such that changes to the quantum system due to varying the time-dependent function $V(t)$ are adiabatic.

At 410, annealer module 120 may anneal the quantum system. In some embodiments, the annealer module 120 may quench energy from the quantum system and perform stochastic Monte Carlo or quantum Monte Carlo algorithms on the quantum system to find the state of the quantum system after the quenching.

At 412, current state information of the quantum system is captured by the unitary evolution module 104. The current state information may include the Hamiltonian $H(t_n)$ and the state $|\psi(t_n)\rangle$ of the quantum system at the current time $t_n$.

In some embodiments, the unitary evolution module 104 may capture the current state information after a number of iterations (i.e., after the quantum system has been evolved over a number time steps $\Delta t$), or after quenching energy from the quantum system.

At 414, the unitary quantum annealer simulator 100 determines whether the current state information corresponds to an optimal or satisfactory solution.

If negative, the process continues at 416, and if affirmative, the process continues at 418.

At 416, values for time dependent functions such $\lambda(t)$ and $V(t)$ may be reset. The time dependent function $\lambda(t)$ and/or $V(t)$ may have a saw-tooth appearance and may be reset after the quantum system is quenched. For example, $\lambda(t)$ may be reset to zero and then increased as the quantum system is evolved, and similarly, $V(t)$ may be reset to $V_0$ and then decreased as the quantum system is evolved.

The process may then return to 406, where the captured state information is utilized to evolve the quantum system.

At 418, the unitary quantum annealer simulator 100 provides a solution output. In some instances, the solution output may include state information of the quantum system that was optimized. In some instances, the solution output may include classical system state information. The classical system state information may correspond to the classical limit of the state information for the quantum system that was optimized.

In some embodiments, the decision at 414 may be omitted. The quantum system may simply be allowed to evolve for a predetermined number of time steps and/or for a predetermined number of quenches.

Illustrative Computing Device

Figure 5:
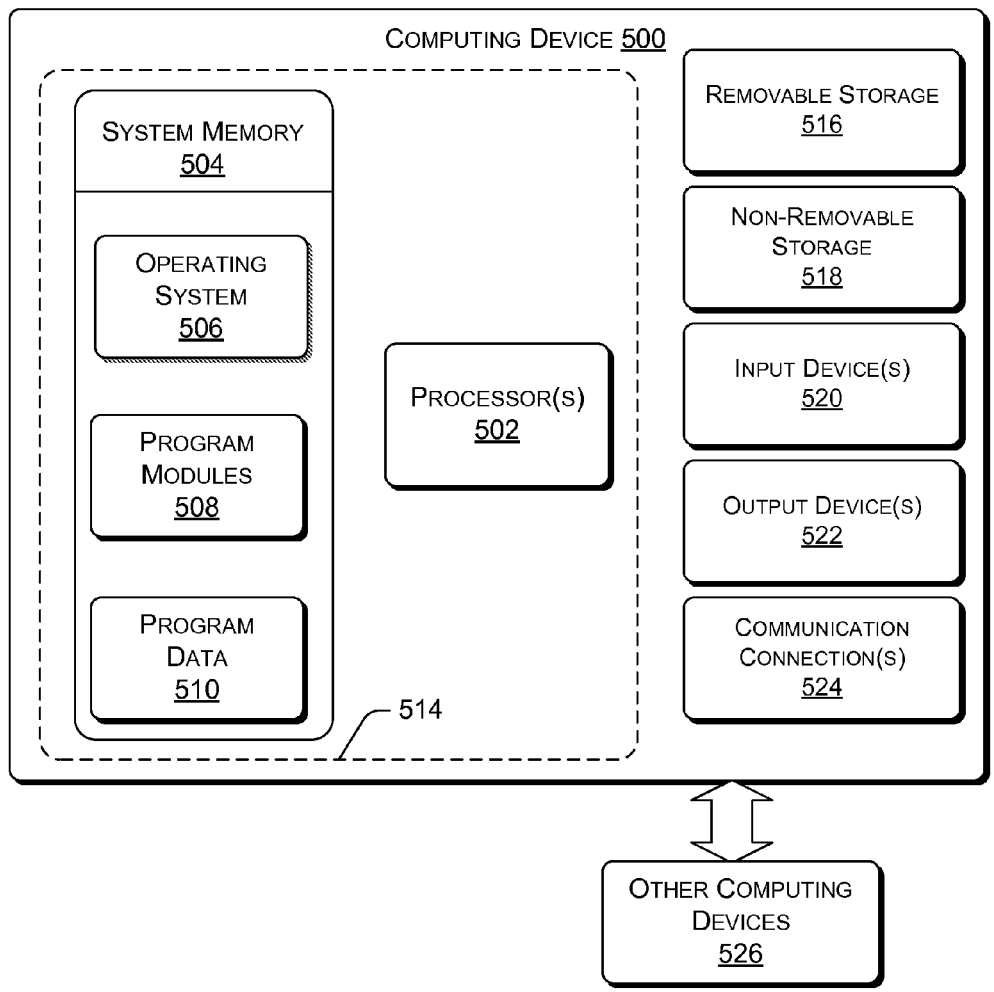
FIG. 5 is a block diagram of an illustrative computing device that may be utilized to implement the quantum annealer simulator of FIG. 1.

FIG. 5 shows an illustrative computing device 500 that may be used to implement the quantum annealer simulator 100. It will readily be appreciated that the various embodiments described above may be implemented in other computing devices, systems, and environments. The computing device 500 shown in FIG. 5 is only one example of a computing device and is not intended to suggest any limitation as to the scope of use or functionality of the computer and network architectures. The computing device 500 is not intended to be interpreted as having any dependency or requirement relating to any one or combination of components illustrated in the example computing device.

In a very basic configuration, the computing device 500 typically includes at least one processor 502 and system memory 504. The processor 502 is a non-quantum processing unit such as, for example, a conventional computer processor such as a digital processor. Depending on the exact configuration and type of computing device, the system memory 504 may be volatile (such as RAM), non-volatile (such as ROM, flash memory, etc.) or some combination of the two. The system memory 504 typically includes an operating system 506, one or more program modules 508, and may include program data 510. The computing device 500 is of a very basic configuration demarcated by a dashed line 514.

The computing device 500 may have additional features or functionality. For example, the computing device 500 may also include additional data storage devices (removable and/or non-removable) such as, for example, magnetic disks, optical disks, or tape. Such additional storage is illustrated in FIG. 5 by removable storage 516 and non-removable storage 518. Computer-readable media may include, at least, two types of computer-readable media, namely computer storage media and communication media. Computer storage media may include volatile and non-volatile, removable, and non-removable media implemented in any method or technology for storage of information, such as computer readable instructions, data structures, program modules, or other data. The system memory 504, the removable storage 516 and the non-removable storage 518 are all examples of computer storage media. Computer storage media includes, but is not limited to, RAM, ROM, EEPROM, flash memory or other memory technology, CD-ROM, digital versatile disks (DVD), or other optical storage, magnetic cassettes, magnetic tape, magnetic disk storage or other magnetic storage devices, or any other non-transmission medium that can be used to store the desired information and which can be accessed by the computing device 500. Any such computer storage media may be part of the computing device 500. Moreover, the computer-readable media may include computer-executable instructions that, when executed by the processor(s) 502, perform various functions and/or operations described herein.

In contrast, communication media may embody computer-readable instructions, data structures, program modules, or other data in a modulated data signal, such as a carrier wave, or other transmission mechanism. As defined herein, computer storage media does not include communication media.

The computing device 500 may also have input device(s) 520 such as keyboard, mouse, pen, voice input device, touch input device, etc. Output device(s) 522 such as a display, speakers, printer, etc. may also be included. These devices are well known in the art and are not discussed at length here.

The computing device 500 may also contain communication connections 524 that allow the device to communicate with other computing devices 526, such as over a network. These networks may include wired networks as well as wireless networks. The communication connections 524 are one example of communication media.

It is appreciated that the illustrated computing device 500 is only one example of a suitable device and is not intended to suggest any limitation as to the scope of use or functionality of the various embodiments described. Other well-known computing devices, systems, environments and/or configurations that may be suitable for use with the embodiments include, but are not limited to personal computers, server computers, hand-held or laptop devices, multiprocessor systems, microprocessor-base systems, set top boxes, game consoles, programmable consumer electronics, network PCs, minicomputers, mainframe computers, distributed computing environments that include any of the above systems or devices, and/or the like. For example, some or all of the components of the computing device 500 may be implemented in the unitary quantum annealer simulator 100.

Conclusion

Although the techniques have been described in language specific to structural features and/or methodological acts, it is to be understood that the appended claims are not necessarily limited to the specific features or acts described. Rather, the specific features and acts are disclosed as exemplary forms of implementing such techniques.

What is claimed is:

1. A method for obtaining an optimal solution of a problem, comprising:
approximating, by a classical, non-quantum computing system, unitary evolution of a quantum system, wherein the quantum system corresponds to a classical problem for which an optimal solution is sought;
capturing, by the classical, non-quantum computing system, a current state of the quantum system based at least in part on the approximated unitary evolution of the quantum system; and
determining, by the classical, non-quantum computing system, whether the current state of the quantum system is an approximate optimal solution.

2. The method of claim 1, further comprising:
providing, by the classical, non-quantum computing system, the current state of the quantum system responsive to the determination that the current state of the quantum system is an approximate optimal solution.

3. The method of claim 2, further comprising:
taking a classical, non-quantum limit of the current state of the quantum system to obtain a classical system; and
obtaining a final approximate optimal solution for the classical, non-quantum system based at least in part on the obtained classical system.

4. The method of claim 1, further comprising:
enabling, by the classical, non-quantum computing system, quantum fluctuations of the quantum system.

5. The method of claim 4, further comprising:
controlling a quantum-fluctuation strength parameter during the approximated unitary evolution of the quantum system, wherein the quantum-fluctuation strength parameter has different values at a first stage of evolution of the quantum system and at a second stage evolution of the quantum system.

6. The method of claim 1, wherein the approximating, by the classical, non-quantum computing system, unitary evolution of the quantum system comprises at least one of: (a) applying a mean-field approximation to the quantum system; (b) applying a semi-classical approach to the quantum system; and (c) evolving the quantum system in a truncated Hilbert space.

7. The method of claim 1, further comprising:
quenching energy from the quantum system.

8. The method of claim 7, wherein the quenching energy from the quantum system includes at least one of: (a) evolving the quantum system with complex number time steps, wherein the complex number time steps include a real number portion and an imaginary number portion; and (b) alternating between the unitary evolution of the quantum system and thermal cooling of the quantum system.

9. The method of claim 8, wherein the thermal cooling can be applied by at least one of: (a) an imaginary time evolution or projection algorithm that lowers the energy of the quantum system; (b) a stochastic Monte Carlo; and (c) quantum Monte Carlo algorithm.

10. One or more computer-readable storage media storing computer-executable instructions that, when executed on one or more processors, causes the one or more processors to perform acts comprising:
receiving, at a classical, non-quantum computing system, a quantum system, wherein the quantum system corresponds to a classical problem for which an optimal solution is sought;
approximating, by the classical, non-quantum computing system, unitary evolution of the quantum system;
capturing, by the classical, non-quantum computing system, a current state of the quantum system based at least in part on the approximated unitary evolution of the quantum system; and
determining, by the classical, non-quantum computing system, whether the current state of the quantum system is an approximate optimal solution.

11. The one or more computer-readable storage media as recited in claim 10, wherein the acts further include:
taking a classical, non-quantum limit of the current state of the quantum system to obtain a classical system; and
obtaining a final approximate optimal solution for the classical, non-quantum system based at least in part on the obtained classical system.

12. The one or more computer-readable storage media as recited in claim 10, wherein the acts further include enabling, by the classical, non-quantum computing system, quantum fluctuations of the quantum system.

13. Currently Amended) The one or more computer-readable storage media as recited in claim 12, wherein the acts further include controlling a quantum-fluctuation strength parameter during the approximated unitary evolution of the quantum system, wherein the quantum-fluctuation strength parameter has different values at a first stage of evolution of the quantum system and at a second stage evolution of the quantum system.

14. The one or more computer-readable storage media as recited in claim 10, wherein the approximating, by the classical, non-quantum computing system, unitary evolution of the quantum system comprises at least one of: (a) applying a mean-field approximation to the quantum system; (b) applying a semi-classical approach to the quantum system; and (c) evolving the quantum system in a truncated Hilbert space.

15. The one or more computer-readable storage media as recited in claim 10, wherein the acts further include quenching energy from the quantum system.

16. The one or more computer-readable storage media as recited in claim 10, wherein the quenching energy from the quantum system includes at least one of: (a) evolving the quantum system with complex number time steps, wherein the complex number time steps include a real number portion and an imaginary number portion; and (b) alternating between the unitary evolution of the quantum system and thermal cooling of the quantum system.

17. A quantum annealer simulator comprising:
a non-quantum processor;
a computer readable storage device storing instructions that, when executed by the non-quantum processor, cause the non-quantum processor to perform acts comprising:
approximating unitary evolution of a quantum system, wherein the quantum system corresponds to a classical problem for which an optimal solution is sought;
capturing a current state of the quantum system based at least in part on the approximated unitary evolution of the quantum system; and
determining whether the current state of the quantum system is an approximate optimal solution.

18. The quantum annealer simulator of claim 17, wherein the approximating the unitary evolution of the quantum system by the non-quantum processor comprises at least one of: (a) applying a mean-field approximation to the quantum system; (b) applying a semi-classical approach to the quantum system; and (c) evolving the quantum system in a truncated Hilbert space.

19. The quantum annealer simulator of claim 17, wherein the acts further include quenching energy from the quantum system.

20. The quantum annealer simulator of claim 19, wherein the quenching energy from the quantum system includes at least one of: (a) evolving the quantum system with complex number time steps, wherein the complex number time steps include a real number portion and an imaginary number portion; and (b) alternating between the unitary evolution of the quantum system and thermal cooling of the quantum system.

* * * * *